United States Patent [19]
Berst et al.

[11] Patent Number: 5,646,407
[45] Date of Patent: Jul. 8, 1997

[54] PROCESS OF PRODUCING AN ENCAPSULATED DETECTOR

[75] Inventors: Marc Berst, Schiltigheim, France; Jürgen Eberth, Köln, Germany; Herbert M Jäger, Aachen, Germany; Hans Kämmerling, Eschweiler, Germany; Rainer M. Lieder, Jülich, Germany; Walter Renftle, Düren, Germany

[73] Assignees: Eurisis Measures, Tanneries, France; Universität zu Köln, Cologne; Forschungszentrum Jülich GmbH, Jülich, both of Germany

[21] Appl. No.: 589,658

[22] Filed: Jan. 22, 1996

Related U.S. Application Data

[63] Continuation-in-part of PCT/DE94/00846, Jul. 19, 1994.

[30] Foreign Application Priority Data

Jul. 23, 1993 [DE] Germany ............... 43 24 710.05

[51] Int. Cl.$^6$ ............................................. G01T 1/24
[52] U.S. Cl. ........................................... 250/370.15
[58] Field of Search ............... 250/370.15, 261; 219/121.14, 121.13

[56] References Cited

U.S. PATENT DOCUMENTS

| | | | |
|---|---|---|---|
| 4,230,945 | 10/1980 | Meir et al. | 250/370.15 |
| 4,386,728 | 6/1983 | Torok et al. | 228/111 |

FOREIGN PATENT DOCUMENTS

87/05990  10/1987  WIPO .................. 250/370.15

Primary Examiner—Constantine Hannaher
Attorney, Agent, or Firm—Klaus J. Bach

[57] ABSTRACT

A process for producing an encapsulated detector operating in an ultra high vacuum (UHV) for gamma ($\gamma$) spectroscopy, wherein a detector is placed into a detector chamber portion of a detector containment pot and a lid is placed into the containment pot and both are joined by electron beam welding under vacuum at their top in such a way, that the detector is not exposed to excessive heat and that the vapors generated during welding are condensed before they can reach the detector chamber, whereby a detector capsule capable of maintaining an ultra high vacuum can be produced.

13 Claims, 1 Drawing Sheet

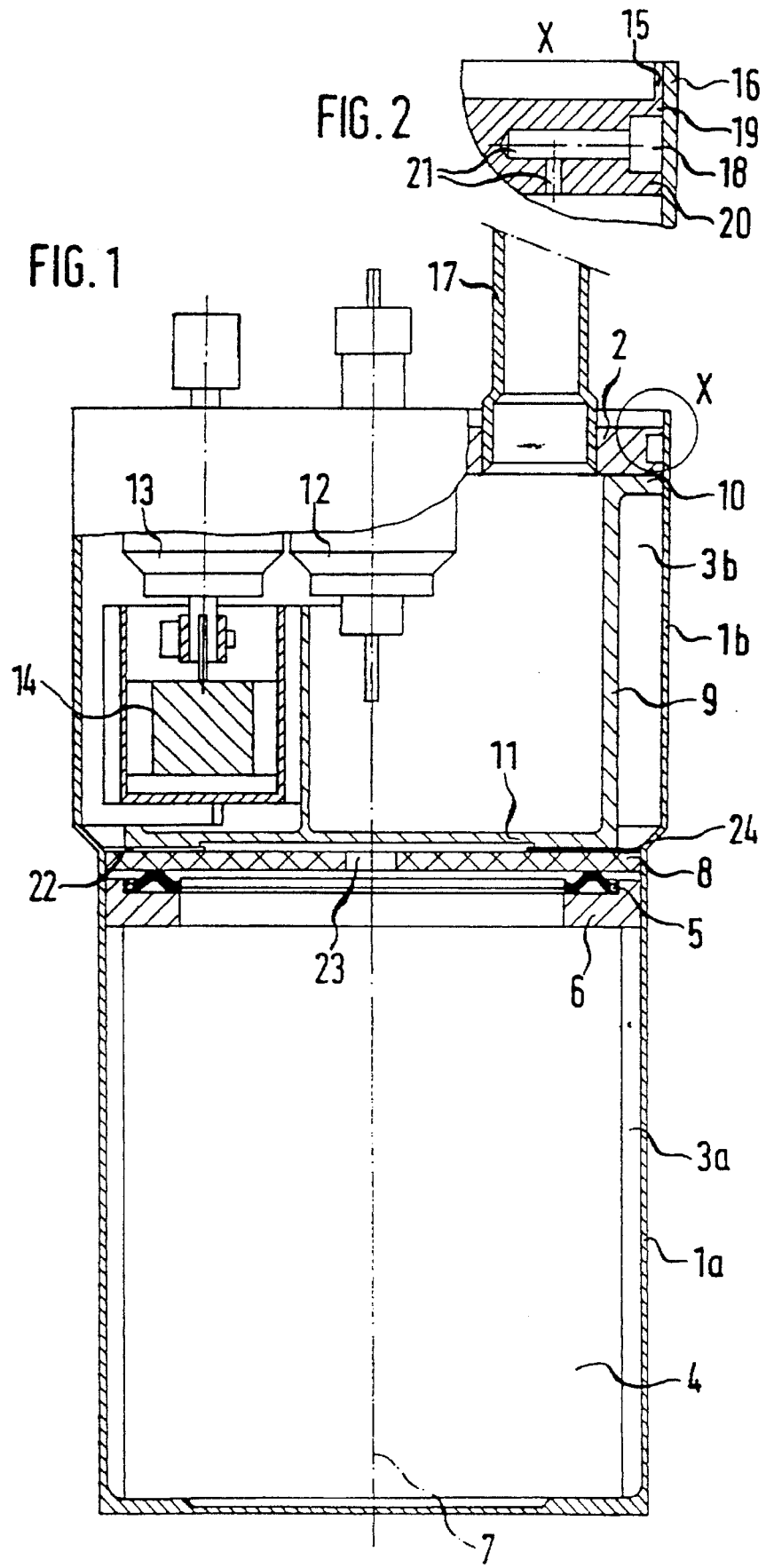

PROCESS OF PRODUCING AN ENCAPSULATED DETECTOR

This is a Continuation-in-part application of the international patent application PCT/DE 94/00846 filed Jul. 19, 1994 and claiming the priority of the German patent application P 43 24 710.5 filed Jul. 23, 1993.

BACKGROUND OF THE INVENTION

The invention resides in a process of producing an encapsulated detector which is operating in an ultra high vacuum (UHV) and which is suitable for use as a gamma ($\gamma$) spectrometer, particularly with an encapsulated germanium (Ge) detector. The detector includes a chamber defined by a containment pot, which is closed by means of a containment lid after the detector is mounted in the detector chamber. The present invention also relates to a capsule for a detector operating at UHV.

For the spectroscopy of $\gamma$-radiation in many areas of research and the industry, detectors of highly purified germanium (HPGe) are utilized. These detectors have a very good energy resolution and a high detection efficiency, properties which facilitate an application in basic nuclear-physical research and in space research but also in environmental monitoring, radiation protection, non-destructive material analysis and industrial manufacturing monitoring.

In order to become operative, Ge-detectors need to be cooled down to about $-190°$ C. by liquid nitrogen. For this purpose the detectors are installed in a vacuum cryostat which, at the same time, protects the very sensitive surfaces of the detectors. The present cryostat technology makes handling and servicing of the detectors difficult and makes it hard to use the same detector for different measuring tasks.

Encapsulated detectors are used for example as $\gamma$-spectrometers for studying fast moving atomic nuclei produced in heavy ion reactions. In order to limit the broadening of the $\gamma$-lines caused by the inherent Doppler effects, it is desirable to minimize the solid angle of the detectors and the detectors should have a high granularity. In the interaction between $\gamma$-radiation and detector materials, scattering occurs in addition to the desired photo effect to be detected, particularly the so-called Compton scattering, which provides for a continuous background in the $\gamma$-radiation spectrum and which deteriorates the detector response function. To minimize this Compton scattering background, the detector is made as large in volume as possible. In addition, an anti-Compton detector is utilized by which the scattered radiation escaping from the detector can be detected and suppressed.

By mounting the detectors in evacuated capsules, a high reliability can be achieved for the experimental results obtainable with the detectors. The highly sensitive surfaces of the detector crystals are protected in the ultra highly evacuated chamber. In this way, handling of the detectors becomes quite simple, particularly during regeneration after radiation damage. Encapsulated detectors can also be advantageously arranged in clusters comprising several detectors so that, by adding the energies deposited in the various detectors in the case of Compton scattering, the total energy of a $\gamma$-quantum can be determined with high accuracy.

In order to obtain a compact structure, particularly for a cluster arrangement, the capsules have to surround the detector crystals as closely as possible. During the vacuum sealing of the capsules after mounting of the detectors, care is to be taken that the quality of the detectors remains undisturbed during closing of the capsules and that they are enclosed in such a manner that the detector chamber remains ultra high vacuum tight for long periods of operation.

It is the object of the present invention to provide a method of producing a capsule for a detector operating in a UHV, wherein the quality of the detector is not detrimentally affected by a capsule surrounding the detector as closely as possible.

SUMMARY OF THE INVENTION

In the process for producing an encapsulated detector operative at ultra high vacuum (UHV) for gamma ($\gamma$) spectroscopy wherein a detector is placed into a detector chamber of a containment pot, a lid is placed on top of the containment pot and both are electron beam welded together under vacuum in such a way that the detector is not exposed to excessive heat and to vapors generated during welding. The vapors are condensed before they can reach the detector chamber.

Particularly, contamination of the surfaces of the detector crystal is prevented by condensing the vapors generated during electron beam welding in a chamber separated from the detector chamber.

A capsule for a Ge detector used as $\gamma$-spectrometer, which is suitable for the method according to the invention, includes a containment pot surrounding the detector chamber and a lid by which the containment pot is closed after installation of the detector. Preferably, a welding seam which is made by electron beam welding in vacuum is formed between the lid and the containment pot in such a way that the detector is protected from thermal exposure during the welding procedure. In addition, the capsule includes at least one chamber separated from the detector chamber wherein any welding vapors coming from the welding seam are condensed before they reach the detector chamber.

For the electron beam welding under vacuum the capsule includes a vent so that, during welding, the detector chamber is in open communication with the space surrounding the capsule which is evacuated for that procedure. As vent preferably a piece of tube is ued which is subsequently utilized to evacuate the detector chamber and which can be cold-welded vacuum-tight by a pinch-off technique after the required ultra high vacuum in the detector chamber has been obtained.

For welding the lid together with the containment pot, the lid is provided with an outwardly projecting welding lip, which, upon placement of the lid into the containment pot, forms a welding seam with the outer edge of the containment pot. The welding lip is so dimensioned that, during the electron beam welding, an ultra-high vacuum tight seal is safely obtained.

It is advantageous if the lid is so designed that, after placement of the lid into the containment pot, there is a volume formed between the lid and the containment pot which defines the chamber for the condensation of the welding vapors. Preferably, the lid has an annular groove to form this chamber which can be evacuated during the electron beam welding procedure. For the condensation of the vapors the chamber has no particular condensation means; instead at least parts of the chamber walls are suitable for this purpose. Under special circumstances the chamber walls may be cooled for retaining the vapor condensate.

For the support of the detector in the detector chamber there is provided a pressure ring whose dimensions are selected so as to provide for the necessary distance between the lid and the detector so that the detector does not become inadequately hot during welding.

In order to prevent welding vapors from entering the detector chamber, a vapor barrier is provided which separates the condensation chamber from the detector chamber. The lid is preferably mounted onto the containment pot by a press fit which guaranties a firm engagement of the lid in the containment pot during the electron beam welding procedure and which prevents transmission of welding vapors to the detector chamber. For that purpose, the lid has preferably a conically shaped rim.

The invention will become more readily apparent from the following description of a particular embodiment thereof.

BRIEF DESCRIPTION OF THE DRAWINGS

FIG. 1 is a longitudinal cross-sectional view of a capsule including a detector, and FIG. 2 is an enlarged view of the structure shown in the circle X of FIG. 1.

DESCRIPTION OF A PREFERRED EMBODIMENT

The capsule shown in FIG. 1 consists of an aluminum alloy and comprises a containment pot (containment pot parts 1a, 1b) and a lid 2. The containment pot encloses a detector chamber, comprising lower and upper chamber areas 3a, 3b. The area 3a in the lower part 1a of the containment pot contains a detector 4, in the example given here, a germanium (Ge) detector which serves as a γ-spectrometer. Besides Ge, also Silicon (Si) is a suitable detector material for γ-spectroscopy. Using either material detectors with a high energy resolution can be made.

The detector 4 is firmly fitted in the detector chamber area 3a by means of a dished spring 5. The dished spring 5 is held in in place by a centering ring 6 so as to be concentric with the axis 7 of the containment pot. The centering ring 6 rests, with its front face, on the detector 4 and holds it in position in the detector chamber area 3a.

The dished spring 5 is held in place by a ceramic disc 8 retained in position by a pressure ring 9 which is held down by the lid 2. For this purpose, the pressure ring 9 has a flange 10 with an outer edge so dimensioned that the pressure ring 9 is centered when it is inserted into the containment pot. The length of the pressure ring 9 defines, in the upper chamber area 3b between the lid 2 and bottom 11 of the pressure ring 9, a gap which, during electron beam welding of the containment pot and the lid, serves as thermal protection for the detector 4 disposed in the lower chamber area 3a of the containment pot.

FIG. 1 shows schematically penetrations 12, 13 in the lid 2 for the connection of the detector with signal transmission and high voltage cables. The penetration 13 serves as electric current feed-through structure for a getter element 14 by which the required high vacuum in the detector chamber is maintained by absorption of residual gas molecules.

The lid 2 closing the detector chamber areas 3a, 3b is provided with a welding lip 15 which, after insertion of the lid 2 into the containment pot, projects outwardly and which is electron beam welded together with the upper edge of rim 16 of the upper part of the containment pot (see insert X, FIG. 2). The thickness of the welding lip 15 is about the same or only slightly less than that of the rim 16 of the upper part 1b of the containment pot, in order to achieve a safe ultra high vacuum seal between the lid and the containment pot.

The electron beam welding of the lid 2 and the containment pot takes place under vacuum. In order to provide for pressure equalization between the detector chamber and the capsule environment during the electron beam welding, a tube 17 extends through the lid 2 so that, after completion of the welding procedure, the detector chamber can be evacuated to complete the capsule manufacture. Like the capsule, the tube 17 consists of aluminum. When a sufficiently high vacuum has been established in the detector chamber by evacuation through the tube 17, the tube is cold-welded by a pinch-off technique so as to achieve an ultra high vacuum seal.

In order to prevent welding vapors possibly generated during the electron beam welding from entering the detector chamber that is to prevent them from reaching the detector chamber, the lid includes a chamber 18 in the form of an annular groove 18 wherein welding vapors can be condensed. In the embodiment shown, particularly the outer chamber wall, i.e. the inner wall of the upper part 16 of the containment pot is suitable for the condensation of vapors. If necessary the containment pot can be cooled during electron beam welding.

During electron beam welding the lid 2 is force-fitted into the containment pot against the pressure of the dished spring 5 so as to be firmly engaged in the pot. For this purpose the lid 2 is formed so as to have a conical outer edge 19 by which the lid can be firmly fitted into the upper part 1b of the containment pot. A section (X) of the lid design, where the lid acts at the same time as a vapor barrier 20 during electron beam welding, is presented in an enlarged fashion in FIG. 2. The force-fit provides at the same time for the vapor barrier 20 whereby vapors generated during electron beam welding are retained in the chamber 18 and are condensed there so that they can not enter the detector chamber. After insertion of the lid 2, the welding lip 15 of the lid 2 is welded together with the rim 16 of the containment pot by electron beam welding under vacuum.

Pumping channels 21 shown in FIG. 2 lead from the groove-like condensation chamber 18 in the lid 2 to the upper chamber area 3b. By way of these pumping channels the condensation chamber 18 is evacuated during electron beam welding. Also, during detector operation, the condensation chamber 18 remains under high vacuum in the same way. The pumping channels are so dimensioned that welding vapors are not sucked into the detector chamber.

For the evacuation of the lower detector chamber area 3a, the bottom 11 of the pressure ring 9 and the ceramic disc 8 have openings 22, 23. The openings 22 in the bottom 11 of the pressure ring 9 are arranged between the bars 24 with which the pressure ring 9 is seated on the ceramic disc 8.

What is claimed is:

1. A process of producing an encapsulated detector operating in an ultra high vacuum (UHV) for gamma (g) spectroscopy, said process comprising the following steps: providing a detector containment pot having a bottom area defining a detector chamber and an upper area above said detector chamber, placing a detector into said detector chamber, providing a lid, inserting said lid into said containment pot, and electron beam welding said containment pot and said lid together under vacuum for sealing said containment pot and said lid to form a sealed capsule while protecting said detector from thermal expossure, and condensing any vapors generated during the welding procedure before they can reach said detector chamber.

2. A process as claimed in claim 1, wherein said vapors are condensed in a condensation chamber which is separated from said detector chamber.

3. A capsule for a detector operating in an ultra high vacuum, comprising: a containment pot having a bottom area defining a detector chamber and an upper area above said detector chamber provided with an upwardly projecting rim, a detector disposed in said detector chamber, a lid received in said containment pot and having an upwardly extending welding lip disposed adjacent said rim, said lip and said rim being joined together by electron beam welding for sealing said containment pot and said lid to form a sealed capsule whereby said detector is protected from heat exposure during the welding procedure, said capsule further including a condensation chamber separate from said detector chamber and arranged so as to receive and condense any vapors generated during the electron beam welding of said rim and said welding lip.

4. A capsule according to claim 3, wherein said capsule includes a vent providing for communication between said detector chamber and the capsule environment during welding.

5. A capsule according to claim 4, wherein said vent is provided by a tube for evacuating said detector chamber after electron beam welding, said tube being adapted to be vacuum sealed and cold welded by a pinch-off technique after the required vacuum is established in said detector chamber.

6. A capsule according to claim 3, wherein said lid includes an outwardly directed welding lip disposed adjacent said rim when said lid is disposed in said containment pot.

7. A capsule according to claim 3, wherein said lid is so shaped that, when mounted in said containment pot, it defines with said containment pot a volume forming said condensing chamber for condensing said welding vapors.

8. A capsule according to claim 7, wherein said lid has an annular groove which can be evacuated during electron beam welding.

9. A capsule according to claim 7, wherein at least some of the walls defining said condensing chamber are suitable for condensing said welding vapors.

10. A capsule according to claim 3, wherein said capsule includes pumping channels in communication with said detector chamber for the evacuation of said condensing chamber.

11. A capsule according to claim 3, wherein said lid includes a spring loaded pressure ring for engaging said detector in said detector chamber.

12. A capsule according to claim 3, wherein a vapor barrier is arranged between said detector chamber and said condensation chamber for separating said detector chamber from said condensation chamber.

13. A capsule according to claim 12, wherein said lid is provided with a press-fit mounting structure sized such that said lid fits into said containment pot with a press-fit.

* * * * *